US006728144B2

United States Patent
Nygren

(10) Patent No.: US 6,728,144 B2
(45) Date of Patent: Apr. 27, 2004

(54) METHOD AND CIRCUIT CONFIGURATION FOR GENERATING A DATA STROBE SIGNAL FOR VERY FAST SEMICONDUCTOR MEMORY SYSTEMS

(75) Inventor: Aaron Nygren, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/208,445

(22) Filed: Jul. 29, 2002

(65) Prior Publication Data

US 2003/0035327 A1 Feb. 20, 2003

(30) Foreign Application Priority Data

Jul. 27, 2001 (DE) .......................................... 101 36 852

(51) Int. Cl.[7] .................................................. G11C 7/00
(52) U.S. Cl. ...................................... 365/193; 365/233
(58) Field of Search ................................ 365/193, 233, 365/191, 189.04

(56) References Cited

U.S. PATENT DOCUMENTS 6,198,674 B1 * 3/2001 Kim ............................ 365/193
6,205,083 B1   3/2001 Foss et al.
6,288,971 B1 * 9/2001 Kim ............................ 365/233

OTHER PUBLICATIONS

"DDR SDRAM Functionally and Controller Read Data Capture", Micron Technology Inc., Ryan, K., vol. 8, Issue 3, 1999, pp. 1–24.

* cited by examiner

*Primary Examiner*—Thong Q. Le
(74) *Attorney, Agent, or Firm*—Laurence A. Greenberg; Werner H. Stemer; Gregory L. Mayback

(57) ABSTRACT

A method is provided for generating a data strobe signal in order to transmit the latter through a signal line with tristate behavior from/to a semiconductor memory module for writing/reading data to/from the semiconductor module. The data strobe signal, in response to the outputting or the reception of a read/write command, proceeding from the tristate state, is clocked with a predetermined clock frequency after a short preamble period. The data strobe signal is occupied, in the preamble period, by one or more pulses corresponding to the clock frequency. In very fast memory systems, this avoids a temporal offset between a system clock and data acceptance controlled by data strobe signal pulses. A semiconductor circuit configuration having a semiconductor circuit module with a circuit for generating such a data strobe signal, is also provided.

7 Claims, 2 Drawing Sheets

METHOD AND CIRCUIT CONFIGURATION FOR GENERATING A DATA STROBE SIGNAL FOR VERY FAST SEMICONDUCTOR MEMORY SYSTEMS

BACKGROUND OF THE INVENTION

Field of the Invention

The invention relates to a method for generating a data strobe signal in order to transmit the latter over a signal line with tristate behavior from/to a semiconductor memory module for writing/reading data to/from the semiconductor module. The data strobe signal, in response to the outputting or the reception of a read/write command, proceeding from the tristate state, is clocked with a predetermined clock frequency after a short preamble period. The invention also relates to a semiconductor circuit configuration having a semiconductor circuit module with a circuit for generating such a data strobe signal.

In known fast semiconductor memory systems, a clocked write data strobe signal is applied for the purpose of writing data to a semiconductor memory module. Conversely, when data are read from the semiconductor memory module, the latter itself generates a read data strobe signal which is fed to a memory controller, for example. Those data strobe signals are usually transmitted over a signal line with tristate behavior, so that they have a tristate state before they are clocked by a memory controller or the semiconductor memory module. The tristate state makes it possible to use bidirectional signal lines for the transmission of the write data strobe signal and the read data strobe signal, respectively, to and from the semiconductor memory module. As a result, it is possible to reduce power consumption during times when the data strobe signal is not activated. The known fast memory systems require the data strobe signal, after leaving the tristate state, immediately before its activation, to assume a known state, for example the "low" state, during a defined very short time duration before it is clocked. That short time duration is called the preamble period. In that case, however, an effect arises whereby the first clocked pulse of the data strobe signal that directly follows the preamble period is offset relative to the system clock system or whereby its edge is delayed. Timing errors thus result during the writing of the data signals to the semiconductor memory module or the reading of the data signals from the semiconductor memory module.

SUMMARY OF THE INVENTION

It is accordingly an object of the invention to provide a method for generating a data strobe signal for very fast semiconductor memory systems and a semiconductor circuit configuration with a semiconductor circuit module for the data strobe signal generation, which overcome the hereinafore-mentioned disadvantages of the heretofore-known methods and devices of this general type, which avoid problems associated with conventional generation of the data strobe signals and wherein a temporal position of the data strobe signal is precisely defined.

With the foregoing and other objects in view there is provided, in accordance with the invention, a method for generating a data strobe signal, which comprises transmitting the data strobe signal over a signal line with tristate behavior from/to a semiconductor memory module for writing/reading data to/from the semiconductor memory module. The data strobe signal, in response to outputting or receiving a read or write command, proceeds from the tristate state, is put or displaced into a predetermined state during a defined short preamble period and is clocked with a predetermined clock frequency immediately afterward. The data strobe signal is toggled in the preamble period with at least one pulse corresponding to the clock frequency.

Accordingly, the preamble period of the data strobe signal is occupied by one or more pulses which correspond to the clock frequency of the system clock. The number of pulses put into the preamble period depends on the system requirements. The pulses which occupy the preamble period immediately before the actual data strobe signal pulse that is provided for the data acceptance ensure that the first switch-on/off state (pulse) of the data strobe signal can be ignored by the system. The following switch-on/off state or states has or have a precise temporal position relative to the system clock.

With the objects of the invention in view, there is also provided a semiconductor circuit configuration, comprising a data strobe generating circuit which is provided in a semiconductor circuit module, such as a memory module or a memory controller module, and is set up for generating the data strobe signal with one or more pulses having a clock frequency that corresponds to the clock signal, during the preamble period.

With the data strobe signal generated according to the invention, a signal line with tristate behavior that transmits this data strobe signal may be a bidirectional signal line. Through this line it is possible both to transmit the write data strobe signals from a memory controller to a semiconductor memory module and to transmit read data strobe signals from a semiconductor memory module to a memory controller.

Other features which are considered as characteristic for the invention are set forth in the appended claims.

Although the invention is illustrated and described herein as embodied in a method and a circuit configuration for generating a data strobe signal for very fast semiconductor memory systems, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
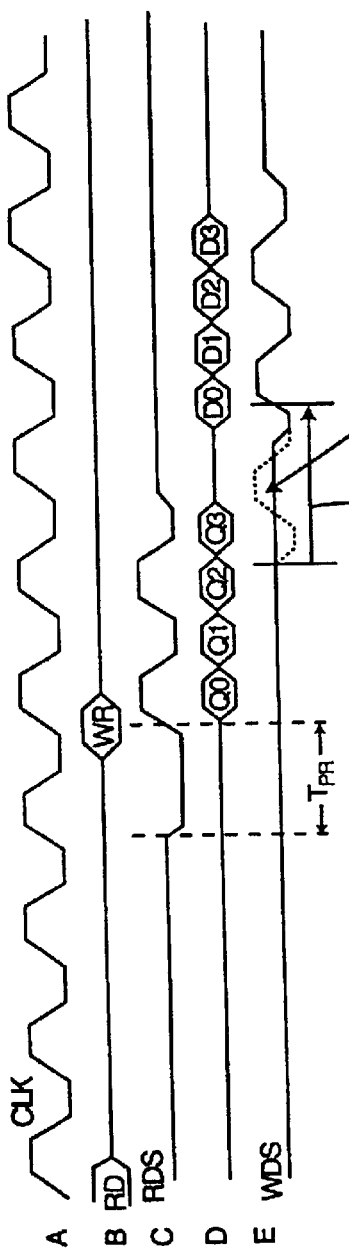
FIG. 1 is a signal timing diagram provided for elucidating a data strobe signal generated in accordance with the invention, in comparison with a conventional data strobe signal.

Referring now to the figures of the drawings in detail and first, particularly, to FIG. 1 thereof, there is seen a signal timing diagram wherein a first row A shows a clock signal, for example a system clock CLK, a second row B shows a read command RD and a write command WR and a third row C shows a conventional read data strobe signal RDS generated in a manner dependent on the read command RD. It can be discerned that the read data strobe signal RDS firstly has a tristate state and then assumes a defined (low) state during a preamble period $T_{PR}$. After the preamble period $T_{PR}$, the data strobe signal RDS begins to toggle, or it is clocked with the frequency of the clock signal CLK. The read data strobe signal RDS serves for storing read data Q0, Q1, Q2, Q3, shown in a fourth row D of FIG. 1, in a memory controller, for example. A fifth row E of FIG. 1 shows a write data strobe signal WDS having a signal waveform according to the invention. According to the invention, the preamble period $T_{PR}$ is occupied by pulses Pt (depicted by a broken line) which have the same frequency as subsequent pulses of the write data strobe signal.

Figure 2:
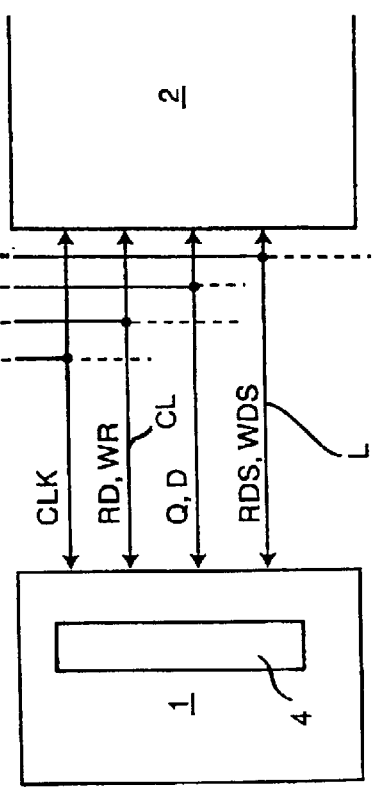
FIG. 2 is a fragmentary, block diagram of a semiconductor circuit configuration in the form of memory system wherein a memory controller is connected to a semiconductor memory module through a bidirectional bus system.

A semiconductor circuit configuration in the form of a memory system shown in FIG. 2 has, for example, a semiconductor memory module 1 and a memory controller 2 connected to the semiconductor memory module 1. A bus system 3, which is used for a signal connection of the two modules 1 and 2, has a bus line for the system clock CLK, bus or command lines CL for read and write commands RD, WR, bus lines for read and write data Q, D and a common bidirectional bus line L with tristate behavior for the read data strobe and write data strobe signals RDS, WDS (further bus lines are omitted for the sake of simplicity). A data strobe generating circuit 4 is shown within the module 1.

A memory system as is shown by way of example in FIG. 2 is defined in such a way that it ignores the pulse Pt falling within the preamble period $T_{PR}$ or a plurality of pulses Pt of the data strobe signal that fall within the preamble period $T_{PR}$. It uses only the first and further toggle pulses of the data strobe signal after the preamble period $T_{PR}$ as an actual data strobe signal for data acceptance.

Figure 3:
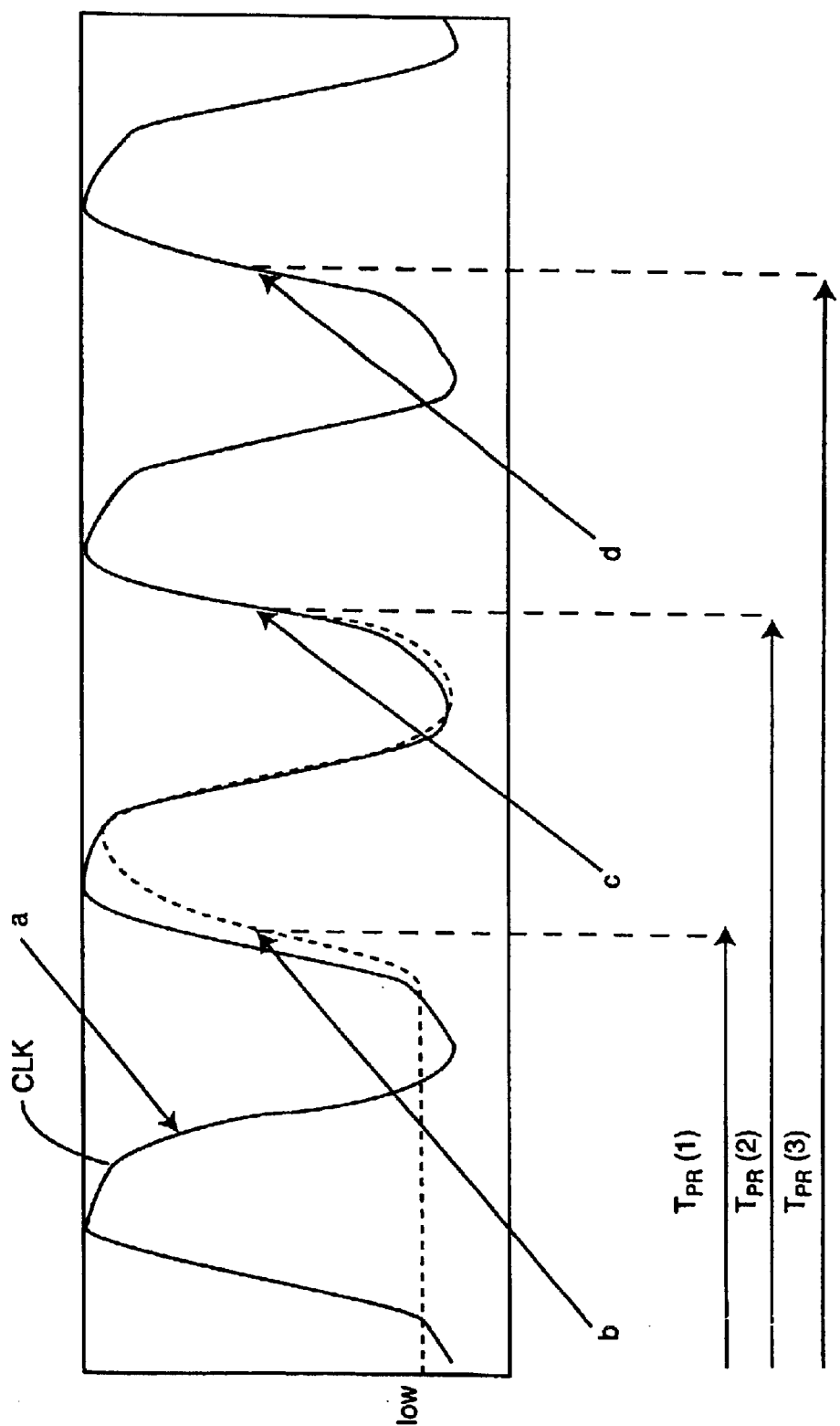
FIG. 3 is a pulse timing diagram which illustrates more precisely the position and the form of a data strobe signal according to the invention, relative to a system clock.

A pulse timing diagram illustrated in FIG. 3 shows details of a data strobe signal according to the invention. Reference symbol a designates a clock signal CLK and reference symbol b designates a first toggle pulse of a known data strobe signal (depicted by a broken line) after a preamble period $T_{PR}(1)$, having a leading edge with which known systems accept data. This means that, in the case of the known data strobe signal, the preamble period $T_{PR}(1)$ ends at an instant designated by an arrow b. The known data strobe signal has a defined low level "low" throughout the preamble period $T_{PR}(1)$. An arrow c designates a leading edge of the next data strobe pulse, with which, according to the invention, data are accepted at the instant that a preamble period $T_{PR}(2)$ is ended. It is clear that at an instant designated by an arrow c, very precise correspondence between the data strobe pulse and the clock signal CLK prevails. However, at the instant designated by the arrow b, there is an offset between the clock signal CLK and the very first pulse of the data strobe signal. The congruence between the clock signal CLK and the data strobe pulse is even more exact at the instant of the end of a preamble period $T_{PR}(3)$ that is designated by an arrow d.

A period duration of the clock signal CLK may, for example, be 2 ns. Although the temporal deviation of the known data strobe pulse from the clock signal CLK at the instant b lies in the sub-nanosecond range, in high-speed memory systems timing errors can occur during a data acceptance activated by the data strobe signal. This is avoided by means of the data strobe signal generated in accordance with the invention, since the first data strobe pulse falling within the preamble period $T_{PR}(2)$ is ignored and only the second data strobe pulse, which corresponds very well to the clock signal CLK with respect to time, with its leading edge designated by the arrow c, is used for the data acceptance. Depending on the system requirement, the leading edge of a third pulse, which is designated by an arrow d, can also be used for the data acceptance, in which case two pulses of the data strobe signal that fall within the preamble period $T_{PR}(3)$ are then ignored.

I claim:

1. A method for generating a data strobe signal, which comprises:

transmitting the data strobe signal over a signal line with tristate behavior from or to a semiconductor memory module for writing or reading data to or from the semiconductor memory module;

the data strobe signal, in response to outputting or receiving a read or write command, proceeding from the tristate state, being put into a predetermined state during a defined short preamble period and being clocked with a predetermined clock frequency immediately afterward; and toggling the data strobe signal in the preamble period with at least one pulse corresponding to the clock frequency.

2. The method according to claim 1, wherein the data strobe signal is a write data strobe signal transmitted through the signal line to the semiconductor memory module.

3. The method according to claim 1, wherein the data strobe signal is a read data strobe signal generated by the semiconductor memory module and transmitted from the semiconductor memory module over the signal line.

4. The method according to claim 1, wherein the write data strobe signal and the read data strobe signal are transmitted over the same bidirectional signal line.

5. A semiconductor circuit configuration, comprising:

a semiconductor circuit module;

a signal line connected to said semiconductor circuit module;

a command line connected to said semiconductor circuit module; and a data strobe generating circuit for generating a data strobe signal, said data strobe generating circuit clocking a data strobe signal onto said signal line with tristate behavior in dependence on reception of a corresponding command signal transmitted over said command line after a defined short preamble period with a predetermined clock frequency, and said data strobe generating circuit toggling the data strobe signal, during the preamble period, with at least one pulse corresponding to the predetermined clock frequency.

6. The semiconductor circuit configuration, according to claim 5, wherein said semiconductor circuit module is a large scale integrated semiconductor memory module.

7. The semiconductor circuit configuration, according to claim 5, wherein said semiconductor circuit module is a memory controller module.

* * * * *